United States Patent [19]

Ochi

[11] Patent Number: 5,731,729

[45] Date of Patent: *Mar. 24, 1998

[54] VOLTAGE TRANSIENT SUPPRESSION CIRCUIT FOR PREVENTING OVERVOLTAGES IN POWER TRANSISTOR SYSTEMS

[75] Inventor: Sam Seiichiro Ochi, Cupertino, Calif.

[73] Assignee: IXYS Corporation, Santa Clara, Calif.

[*] Notice: The term of this patent shall not extend beyond the expiration date of Pat. No. 5,500,616.

[21] Appl. No.: 372,748

[22] Filed: Jan. 13, 1995

[51] Int. Cl.$^6$ .................. H03K 17/08; H03K 17/56
[52] U.S. Cl. .............. 327/312; 327/323; 327/384; 327/580; 327/584; 327/420; 361/18
[58] Field of Search ..................... 327/309, 310, 327/312, 313, 327, 328, 375, 377, 379, 381, 502, 504, 420, 421, 422, 427, 432, 434, 438, 314, 325, 331, 384, 387, 389, 323, 580, 584; 361/18, 91, 86, 111

[56] References Cited

U.S. PATENT DOCUMENTS

| | | | |
|---|---|---|---|
| 4,423,457 | 12/1983 | Brajder | 361/86 |
| 4,658,203 | 4/1987 | Freymuth | 361/91 |
| 5,055,721 | 10/1991 | Majumdar et al. | 327/434 |
| 5,304,935 | 4/1994 | Rathke et al. | 361/101 |
| 5,444,591 | 8/1995 | Chokhawala et al. | 361/18 |

FOREIGN PATENT DOCUMENTS 62-207021  11/1987  Japan .................. 327/375

OTHER PUBLICATIONS

Yamazaki, T., et al., "The IGBT with Monolithic Overvoltage Protection Circuit," *Proceedings of the 5th International Symposium on Power Semiconductor Devices and ICs* (1993), pp. 41–45.

*Primary Examiner*—Timothy P. Callahan
*Assistant Examiner*—Terry L. Englund
*Attorney, Agent, or Firm*—Townsend and Townsend and Crew LLP; Joseph M. Villeneuve

[57] ABSTRACT

An apparatus for suppressing voltage transients across a first transistor is described. The first transistor has a first terminal, a second terminal, and a gate terminal, and is characterized by an avalanche breakdown voltage rating between the first and second terminals. The cathode of a first diode is coupled to the first terminal, the first diode having a reverse breakdown voltage which is less than the avalanche breakdown voltage rating. Gate driver circuitry is provided by which the gate terminal of the first transistor is coupled to the anode of the first diode. The gate driver circuitry provides a drive signal to the gate terminal of the first transistor, and comprises a plurality of bipolar transistors. Each bipolar transistor has an anode terminal (i.e., base terminal), a p-n junction, and a cathode terminal (i.e., emitter terminal). The anode terminal of each bipolar transistor is coupled to the anode of the first diode.

25 Claims, 2 Drawing Sheets

VOLTAGE TRANSIENT SUPPRESSION CIRCUIT FOR PREVENTING OVERVOLTAGES IN POWER TRANSISTOR SYSTEMS

BACKGROUND OF THE INVENTION

This invention relates to the suppression of voltage transients which appear across power transistors. In systems employing power transistors there is a need to provide protection from voltage transients which exceed the avalanche breakdown voltages of the power transistors. Voltage transients can occur when a power transistor is abruptly turned off. FIG. 1 shows a simplified schematic of a FET 1 driving a load 2. FIGS. 2a and 2b show idealized plots of the load current, $I_L$, and the FET drain to source voltage, $V_{DS}$, with respect to time, t, for the circuit of FIG. 1. When FET 1 is turned off at $t_0$, the tendency of the load inductance to resist instantaneous changes in load current causes $V_{DS}$ to rise sharply, exceeding the supply voltage, $V_{DD}$, as well as the avalanche breakdown voltage, $V_B$, of the power transistor. $V_{DS}$ eventually settles out to $V_{DD}$, the frequency of the oscillation being dependent upon the values of the load capacitance and inductance, the degree of damping of the oscillation depending on the load resistance.

One technique for protecting power transistors from overvoltages employs snubber circuits. FIG. 3 shows a typical implementation of a snubber circuit 3. The circuit comprises a diode 4 in parallel with a resistor 5, the parallel combination being in series with a capacitor 6. FIGS. 4a and 4b show idealized plots of $I_L$ and $V_{DS}$, with respect to time for the circuit of FIG. 3. As soon as power is applied to the circuit, capacitor 6 charges up to $V_{DD}$. When FET 1 is turned off at $t_0$, $V_{DS}$ begins to rise as in the previous example. However, as soon as diode 4 is forward biased, i.e., when $V_{DS}$ exceeds $V_{DD}$ by greater than approximately 0.7 volts, it begins to conduct current, thereby clamping $V_{DS}$ and charging capacitor 6 to $V_{DD}$+0.7 volts. The excess voltage on capacitor 6 is then discharged through resistor 5. The time required for the voltage to discharge depends upon the values of resistor 5 and capacitor 6.

Unfortunately, snubber circuits tend to be expensive, result in additional complexity, and often provide an inadequate level of protection. For example, a high quality, high voltage, 1 µF capacitor can cost more than the power transistor for which it provides protection. Such capacitors are also relatively large. Thus there is a need for a way in which to provide transient protection for power transistors which is inexpensive, simple, and reliable.

SUMMARY OF THE INVENTION

The present invention provides an apparatus for suppressing voltage transients across a first transistor. The first transistor has a first terminal, a second terminal, and a gate terminal, and is characterized by an avalanche breakdown voltage rating between the first and second terminals. The cathode of a first diode is coupled to the first terminal, the first diode having a reverse breakdown voltage which is less than the avalanche breakdown voltage rating. Gate driver circuitry is provided by which the gate terminal of the first transistor is coupled to the anode of the first diode. The gate driver circuitry provides a drive signal to the gate terminal of the first transistor, and comprises a plurality of semiconductor devices. Each semiconductor device has an anode terminal, a p-n junction, and a cathode terminal. The anode terminal of each semiconductor device is coupled to the anode of the first diode.

In a particular embodiment, the first diode has a reverse breakdown voltage of $0.9*V_B$, where $V_B$ is the avalanche breakdown voltage rating of the first transistor. The gate driver circuitry has two semiconductor devices (e.g., bipolar transistors) with p-n junctions, the anodes of which are coupled to the anode of the first diode. The gate terminal of a first FET is coupled to the cathode terminal of the one of the semiconductor devices. The gate terminal of a second FET is coupled to the source terminal of the first FET, and the source terminal of the second FET is coupled to the cathode terminal of the second semiconductor device and the gate terminal of the first transistor.

In a particular embodiment, the first transistor and the first diode are fabricated on one semiconductor substrate, and the gate driver circuitry is contained in one integrated circuit. Fabrication of the transistor and diode on the same substrate adds little to the cost or complexity of producing the original transistor. The additional devices within the integrated gate driver circuitry are likewise easily and cheaply implemented. Thus, an advantage of the invention is that it provides an inexpensive and easily implemented solution to the problem of providing avalanche breakdown protection for power devices such as MOSFETs, IGBTs, MCTs, and bipolar transistors.

A further understanding of the nature and advantages of the present invention may be realized by reference to the remaining portions of the specification and the drawings.

DESCRIPTION OF THE SPECIFIC EMBODIMENTS

Figure 1:
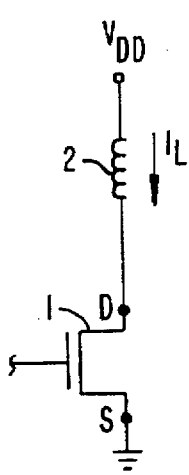
FIG. 1 is a simplified schematic of a FET driving a load.
Figure 2A:
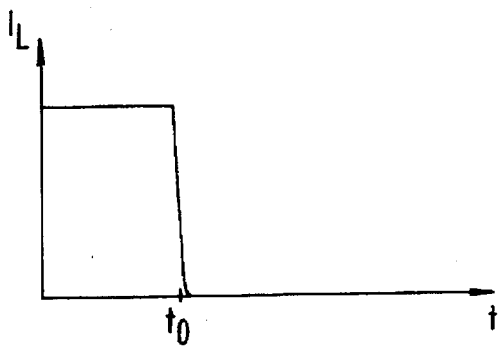
FIGS. 2a and 2b show idealized plots of the load current and the FET drain to source voltage with respect to time for the circuit of FIG. 1.
Figure 2B:
Figure 3:
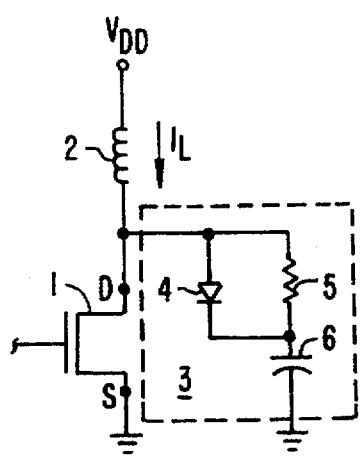
FIG. 3 illustrates a typical implementation of a snubber circuit according to the prior art.
Figure 4A:
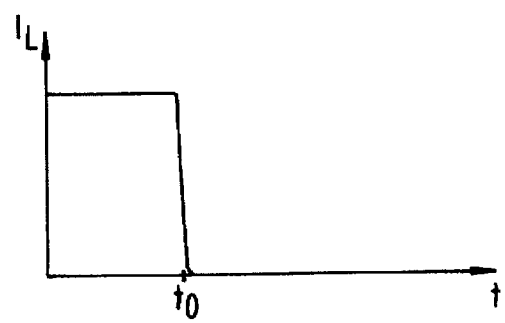
FIGS. 4a and 4b show idealized plots of the load current and the FET drain to source voltage with respect to time for the circuit of FIG. 3.
Figure 4B:
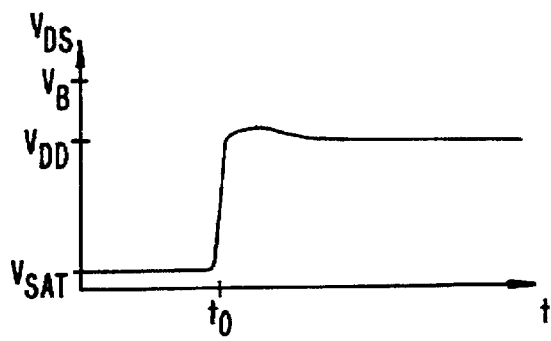
Figure 5:
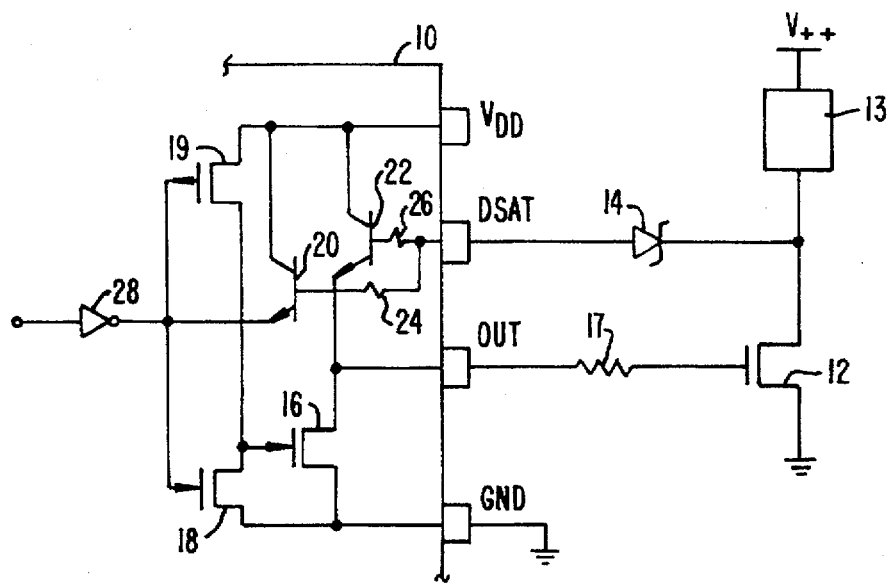
FIG. 5 is a schematic diagram of one embodiment of the present invention.

FIG. 5 is a simplified schematic diagram of a particular embodiment of the present invention. The circuit represents a MOSFET application of the invention in which the gate driver circuitry comprises an integrated circuit 10 having an output terminal for driving the gate of a MOSFET 12 the drain of which is coupled to load 13. In addition to the output, power, and ground terminals, IC 10 has an overvoltage input (DSAT) which senses overvoltage conditions on the drain of MOSFET 12 by means of an avalanche diode 14. When an overvoltage condition occurs, diode 14 breaks down, preventing the drain voltage from exceeding its rated avalanche breakdown voltage. At the same time, the anode of diode 14, and therefore DSAT, is driven to a higher voltage. This turns on two transistors internal to IC 10, one of which (20) turns off an internal MOSFET 16 which normally supplies the gate drive to MOSFET 12, and the other of which (22) drives the gate of MOSFET 12 higher as the overvoltage condition increases. The effect is to keep MOSFET 12 on during the overvoltage condition thus allowing it to sink current, thereby pulling the drain voltage of MOSFET 12 down. It will be understood that the invention can be practiced with other types of power transistors, including insulated gate bipolar transistors (IGBTs), MOS controlled thyristors (MCTs), and bipolar transistors.

With specific reference to FIG. 5, MOSFET 12 has a drain to source avalanche breakdown voltage of $V_{BDSS}$. Avalanche diode 14 has a reverse breakdown rating of $0.9*V_{BDSS}$. It is important to note that the breakdown voltage of diode 14 can be any value less than $V_{BDSS}$ of MOSFET 12, and is not limited to $0.9*V_{BDSS}$. When MOSFET 12 through series resistor 17 is off, FET 16 is on, thus pulling the gate of MOSFET 12 low. FETs 18 and 19 are of opposite conduction types (e.g., n-type and p-type, respectively) thereby alternately connecting the gate of FET 16 to $V_{DD}$ or ground depending upon the voltage at the output of inverter 28. When FET 16 is on, FET 18 is off with a drive voltage ($\sim V_{DD}$) being supplied to the gate of FET 16 via FET 19. If for some reason the drain voltage of MOSFET 12 exceeds $0.9*V_{BDSS}$, diode 14 begins conducting in the reverse direction, and the base terminals of transistors 20 and 22 are pulled up through resistors 24 and 26 respectively. The drain of FET 16, connected to the emitter of transistor 22, is then pulled up, resulting in a temporary high current flow through FET 16. Simultaneously, the output of inverter 28 and the gates of FET 18 and 19 are pulled up by the emitter of transistor 20. FET 18, which was previously in the off state, is turned on by the voltage applied to its gate, and FET 19 is turned off, thereby bringing the gate of FET 16 low, turning FET 16 off. Thus, any voltage at the drain of MOSFET 12 which exceeds $0.9*V_{BDSS}+V_{BE}(20)$ appears on the gate of MOSFET 12. This excess voltage turns MOSFET 12 on, driving its drain voltage down, thereby counteracting the overvoltage condition.

Figure 6:
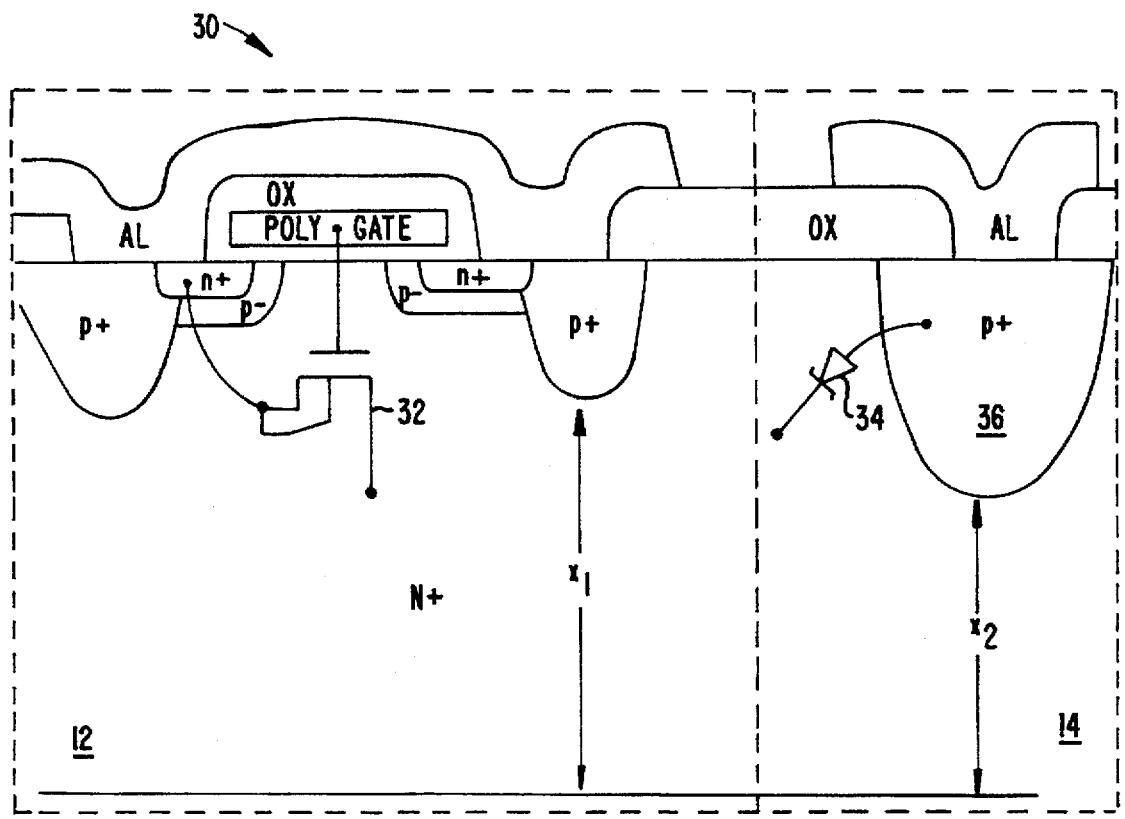
FIG. 6 is a cross-sectional view of a semiconductor device fabricated according to the invention.

The avalanche diode of the invention can be constructed on the same substrate as the power transistor it is intended to protect. FIG. 6 is a cross-sectional view of a semiconductor device 30 fabricated in this manner. The device on the left of the diagram is a MOSFET 12 oriented according to the symbolic representation 32. The device on the right is an avalanche diode 14 oriented according to the symbolic representation 34. As the drawing makes clear, the drain of MOSFET 12 is common with the cathode of avalanche diode 14. A deep P+ diffusion is used for the anode region 36 of avalanche diode 14 to ensure that avalanche diode 14 has a lower breakdown voltage than the main MOSFET 12 (i.e., $x_1$ is greater than $x_2$). The diffusion depth $x_2$ of anode region 36 can be precisely controlled to set the breakdown voltage of avalanche diode 14 at any desired value with respect to the main device 12.

Alternatively, the breakdown voltage of the avalanche diode may be controlled to be below that of its associated power transistor through the use of diffusion guard rings. The spacing of the rings may be adjusted to set the breakdown voltage of the avalanche diode to the desired value. This technique has the advantage of eliminating the extra processing steps associated with the creation of the deep P+ diffusion region 36 described above with reference to FIG. 6.

While the invention has been particularly shown and described with reference to a specific embodiments thereof, it will be understood by those skilled in the art that the foregoing and other changes in the form and details may be made therein without departing from the spirit or scope of the invention.

What is claimed is:

1. An apparatus for suppressing voltage transients in power transistor systems, comprising:

a first transistor having a first terminal for coupling to a load, a second terminal for coupling to ground, a gate terminal, and an avalanche breakdown voltage rating between the first and second terminals, the first and gate terminals having voltages associated therewith;

a first diode having an anode and a cathode, the cathode of the first diode being coupled to the first terminal, the first diode having a reverse breakdown voltage which is less than the avalanche breakdown voltage rating; and gate driver circuitry by which the gate terminal of the first transistor is coupled to the anode of the first diode, the gate driver circuitry for providing a drive signal to the gate terminal of the first transistor, the gate driver circuitry comprising a plurality of semiconductor devices, each semiconductor device having a base terminal and a p-n junction, the base terminal of each semiconductor device being coupled to the anode of the first diode, the gate driver circuitry being operable to increase the voltage at the gate terminal when the voltage at the first terminal exceeds the reverse breakdown voltage.

2. The apparatus of claim 1 wherein the first diode has a reverse breakdown voltage of 0.9*VB, wherein VB is the avalanche breakdown voltage rating between the first and second terminals of the first transistor.

3. The apparatus of claim 1 wherein the first transistor is a metal oxide semiconductor field effect transistor, the cathode of the first diode being coupled to the drain terminal of the metal oxide semiconductor field effect transistor.

4. The apparatus of claim 1 wherein the first transistor is an insulated gate bipolar transistor, the cathode of the first diodes being coupled to the collector terminal of the insulated gate bipolar transistor.

5. The apparatus of claim 1 wherein the first transistor is a metal oxide semiconductor controlled thyristor, the cathode of the first diode being coupled to the drain terminal of the metal oxide semiconductor controlled thyristor.

6. The apparatus of claim 1 wherein the first transistor is a bipolar transistor, the cathode of the first diode being coupled to the collector terminal of the bipolar transistor.

7. The apparatus of claim 1 wherein the first transistor and the first diode are fabricated on the same semiconductor substrate.

8. The apparatus of claim 1 wherein the gate driver circuitry is contained in an integrated circuit.

9. An apparatus for suppressing voltage transients in power transistor systems, comprising:

first transistor having a first terminal for coupling to a load, a second terminal for coupling to ground, a gate terminal, and an avalanche breakdown voltage rating between the first and second terminals;

a first diode having an anode and a cathode, the cathode of the first diode being coupled to the first terminal, the first diode having a reverse breakdown voltage which is less than the avalanche breakdown voltage rating; and gate driver circuitry coupled to the anode of the first diode by which the gate terminal of the first transistor is coupled to the anode of the first diode, the gate driver circuitry for providing a drive signal to the gate terminal of the first transistor, the gate driver circuitry comprising:

a first semiconductor device having a base terminal, a p-n junction, and an emitter terminal, the base terminal of the first semiconductor device being coupled to the anode of the first diode;

a second semiconductor device having a base terminal, a p-n junction, and an emitter terminal, the base terminal of the second semiconductor device being coupled to the anode of the first diode;

a first field effect transistor having a source terminal, a gate terminal, and a drain terminal, the gate terminal of the first field effect transistor being coupled to the emitter terminal of the first semiconductor device; and a second field effect transistor having a source terminal, a gate terminal, and a drain terminal, the gate terminal of the second field effect transistor being coupled to the drain terminal of the first field effect transistor, and the drain terminal of the second field effect transistor being coupled to the emitter terminal of the second semiconductor device and the gate terminal of the first transistor.

10. The apparatus of claim 9 wherein the first diode has a reverse breakdown voltage of 0.9*VB, wherein VB is the avalanche breakdown voltage rating between the first and second terminals of the first transistor.

11. The apparatus of claim 9 wherein the first transistor is a metal oxide semiconductor field effect transistor, the cathode of the first diode being coupled to the drain terminal of the metal oxide semiconductor field effect transistor.

12. The apparatus of claim 9 wherein the first transistor is an insulated gate bipolar transistor, the cathode of the first diode being coupled to the collector terminal of the insulated gate bipolar transistor.

13. The apparatus of claim 9 wherein the first transistor is a metal oxide semiconductor controlled thyristor, the cathode of the first diode being coupled to the drain terminal of the metal oxide semiconductor controlled thyristor.

14. The apparatus of claim 9 wherein the first transistor is a bipolar transistor, the cathode of the first diode being coupled to the collector terminal of the bipolar transistor.

15. The apparatus of claim 9 wherein the first transistor and the first diode are fabricated on the same semiconductor substrate.

16. The apparatus of claim 9 wherein the gate driver circuitry is contained in an integrated circuit.

17. An apparatus for suppressing voltage transients in power transistor systems, comprising:

a first transistor having a first terminal for coupling to a load, a second terminal for coupling to ground, a gate terminal, and an avalanche breakdown voltage rating between the first and second terminals;

a first diode having an anode and a cathode, the cathode of the first diode being coupled to the first terminal, the first diode having a reverse breakdown voltage which is less than the avalanche breakdown voltage rating; and gate driver circuitry coupled to the anode of the first diode by which the gate terminal of the first transistor is coupled to the anode of the first diode, the gate driver circuitry for providing a drive signal to the gate terminal of the first transistor, the gate driver circuitry comprising:

a first bipolar transistor having a collector terminal, a base terminal, and an emitter terminal, the base terminal of the first bipolar transistor being coupled to the anode of the first diode;

a second bipolar transistor having a collector terminal, a base terminal, and an emitter terminal, the base terminal of the second bipolar transistor being coupled to the anode of the first diode;

a first field effect transistor having a source terminal, a gate terminal, and a drain terminal, the gate terminal of the first field effect transistor being coupled to the emitter terminal of the first bipolar transistor; and a second field effect transistor having a source terminal, a gate terminal, and a drain terminal, the gate terminal of the second field effect transistor being coupled to the drain terminal of the first field effect transistor, and the drain terminal of the second field effect transistor being coupled to the emitter terminal of the second bipolar transistor and the gate terminal of the first transistor.

18. The apparatus of claim 17 wherein the first diode has a reverse breakdown voltage of 0.9*VB, wherein VB is the avalanche breakdown voltage rating between the first and second terminals of the first transistor.

19. The apparatus of claim 17 wherein the first transistor is a metal oxide semiconductor field effect transistor, the cathode of the first diode being coupled to the drain terminal of the metal oxide semiconductor field effect transistor.

20. The apparatus of claim 17 wherein the first transistor is an insulated gate bipolar transistor, the cathode of the first diode being coupled to the collector terminal of the insulated gate bipolar transistor.

21. The apparatus of claim 17 wherein the first transistor is a metal oxide semiconductor controlled thyristor, the cathode of the first diode being coupled to the drain terminal of the metal oxide semiconductor controlled thyristor.

22. The apparatus of claim 17 wherein the first transistor is a bipolar transistor, the cathode of the first diode being coupled to the collector terminal of the bipolar transistor.

23. The apparatus of claim 17 wherein the first transistor and the first diode are fabricated on the same semiconductor substrate.

24. The apparatus of claim 17 wherein the gate driver circuitry is contained in an integrated circuit.

25. A monolithic device, comprising:

a transistor having a first terminal for coupling to a load, a second terminal for coupling to ground, a gate terminal, and an avalanche breakdown voltage rating between the first and second terminals; and a diode having an anode and a cathode, the cathode being coupled to the first terminal, the diode having a reverse breakdown voltage rating which is less than the avalanche breakdown voltage rating, the diode being fabricated on the same semiconductor substrate as the transistor.

* * * * *